(12) United States Patent
Horimoto

(10) Patent No.: US 6,297,756 B1
(45) Date of Patent: Oct. 2, 2001

(54) ANALOG-TO-DIGITAL CONVERSION DEVICE

(75) Inventor: Masashi Horimoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/522,405

(22) Filed: Mar. 9, 2000

(30) Foreign Application Priority Data

Mar. 9, 1999 (JP) ................................................ 11-061861

(51) Int. Cl.$^7$ ..................................................... H03M 1/12
(52) U.S. Cl. ............................................. 341/118; 341/155
(58) Field of Search ..................................... 341/155, 144, 341/118, 115, 116

(56) References Cited

U.S. PATENT DOCUMENTS

| | | | |
|---|---|---|---|
| 4,562,471 | * 12/1985 | Eouzan et al. | 358/172 |
| 4,590,458 | * 5/1986 | Evans et al. | 341/118 |
| 4,972,189 | * 11/1990 | Polito et al. | 341/118 |
| 5,053,770 | * 10/1991 | Mayer et al. | 341/118 |
| 5,084,700 | * 1/1992 | Christopher | 341/118 |
| 5,105,276 | * 4/1992 | Schrock | 341/118 |
| 6,215,427 | * 4/2001 | Bonhoure et al. | 341/118 |

FOREIGN PATENT DOCUMENTS

0911976 * 4/1999 (EP) .

* cited by examiner

*Primary Examiner*—Howard L. Williams
*Assistant Examiner*—Jean Bruner Jean Glaude
(74) *Attorney, Agent, or Firm*—Arent Fox Kintner Plotkin & Kahn, PLLC

(57) ABSTRACT

An A/D conversion device has a signal input terminal for receiving an analog signal, an A/D converter for converting the received analog signal into a digital signal, and a signal output terminal for outputting the digital signal. The A/D conversion device also has a direct-current voltage input terminal for receiving a direct-current voltage from a direct-current voltage source whose output voltage can be varied. To the direct-current voltage input terminal, a first resistor, a second resistor, and a constant voltage source are connected in series in this order. To the node between the first and second resistors, the input terminal of an amplifier is connected. Between the signal input terminal and the A/D converter, an operational amplifier is connected. The operational amplifier has first and second input terminals and an output terminal, with the first input terminal connected to the signal input terminal, and with the second input terminal connected through a third resistor to the output terminal of the operational amplifier itself and connected also to the output terminal of the amplifier.

3 Claims, 3 Drawing Sheets

ANALOG-TO-DIGITAL CONVERSION DEVICE

BACKGROUND OF THE INVENTION

1. Field of the Invention

The present invention relates to an analog-to-digital (hereinafter also "A/D") conversion device that converts an analog signal fed thereto into a digital signal and outputs the digital signal, and more particularly to an A/D conversion device having an input level adjustment function for adjusting the DC (direct-current) level of the analog signal fed thereto.

2. Description of the Prior Art

In analog-to-digital conversion, a fluctuation in the DC level of an input analog signal causes a distortion in the digital signal obtained as a result of analog-to-digital conversion. This is because analog-to-digital conversion can cope with a limited range of voltages.

To prevent such distortion, some A/D conversion devices are provided with an input level adjustment function for adjusting the DC level of the analog signal that is to be subjected to analog-to-digital conversion. The circuit configuration of a conventional A/D conversion device having such an input level adjustment function is shown in FIG. 3. As shown in FIG. 3, this A/D conversion device is composed of an operational amplifier 1, resistors 2 and 3, an A/D converter that performs A/D conversion on a signal fed thereto and outputs the resulting signal, and a variable constant voltage source 50 that produces a constant voltage that can be varied.

To the non-inverting input terminal (+) of the operational amplifier 1, an analog signal fed in via a signal input terminal $T_1$ is fed. On the other hand, the inverting input terminal (−) of the operational amplifier 1 is connected through the resistor 2 to the output terminal of the operational amplifier 1 itself, and is connected also through the resistor 3 to the variable constant voltage source 50. The signal output from the operational amplifier 1 is subjected to A/D conversion by the A/D converter 4, and is then output via terminals $T_{O1}, T_{O2}, \ldots, T_{On}$.

With respect to the operational amplifier 1, negative feedback is achieved through the resistor 2. Accordingly, if it is assumed that the voltage fed in via the terminal $T_I$ is $V_I$, the resistances of the resistors 2 and 3 are $R_f$ and $R$ respectively, and the constant voltage output from the variable constant voltage source 50 is $V_B$, then the voltage $V_A$ of the analog signal fed to the A/D converter 4 is given by $$V_A = \{(R_f + R)/R\}V_I - (R_f/R)V_B$$

Accordingly, by adjusting the constant voltage $V_B$ of the variable constant voltage source 50, it is possible to adjust the DC level of the analog signal fed to the A/D converter 4. In this way, even if a fluctuation occurs in the DC level of the analog signal that is fed in via the terminal $T_I$ so as to be subjected to A/D conversion, or even if an offset occurs in the output of the operational amplifier 1, it is possible to prevent the output digital signal from being distorted.

However, in this conventional A/D conversion device, to vary the DC level of the voltage $V_A$ of the analog signal fed to the A/D converter 4 by $\Delta V_A$, the constant voltage $V_B$ of the variable constant voltage source 50 needs to be varied by $\Delta V_B$, which is given by $$\Delta V_B = -(R/R_f) \times \alpha V_A$$

Thus, depending on the values at which the resistances $R_f$ and R are actually set, the voltage $V_B$ of the variable constant voltage source 50 needs to be adjusted within an extremely narrow range (more specifically, the farther $R_f$ is higher than R, the narrower the range of adjustment), which makes the adjustment of the voltage $V_B$ of the variable constant voltage source 50 extremely difficult.

SUMMARY OF THE INVENTION

An object of the present invention is to provide an analog-to-digital conversion device having an input level adjustment function that allows adjustments needed to prevent the output digital signal from being distorted to be made with more ease.

To achieve the above object, according to one aspect of the present invention, an A/D conversion device having an input level adjustment function that converts an analog signal fed thereto into a digital signal to be output and that allows adjustment of the DC level of the analog signal fed thereto to be converted into a digital signal is composed of a terminal for receiving a voltage from the outside, a voltage division circuit for dividing the voltage difference between the voltage received at the terminal and an internal constant voltage, a buffer amplifier that receives the voltage resulting from voltage division performed by the voltage division circuit, an amplifier that receives the analog signal to be converted and that has a negative feedback circuit that uses as a reference voltage the voltage output from the buffer amplifier, and an A/D converter for converting the signal output from this amplifier into a digital signal.

According to this circuit configuration, by adjusting the voltage fed in from the outside, it is possible to vary the DC level of the analog signal fed to the A/D circuit. Moreover, a given change in the DC level can be achieved by adjusting the voltage in a wider range than ever.

According to another aspect of the present invention, an analog-to-digital conversion device is provided with: a signal input terminal for receiving an analog signal; a direct-current voltage source whose output voltage can be varied; a direct-current voltage input terminal for receiving a direct-current voltage output from the direct-current voltage source; a first resistor, a second resistor, and a constant voltage source connected in series in this order from the direct-current voltage input terminal; an amplifier having an input terminal connected to the node between the first and second resistors; an operational amplifier having a first input terminal, a second input terminal, and an output terminal, of which the first input terminal is connected to the signal input terminal and of which the second input terminal is connected through a third resistor to the output terminal of the operational amplifier itself and connected also to the output terminal of the amplifier; an analog-to-digital converter for performing analog-to-digital conversion on the output voltage of the operational amplifier; and a signal output terminal for outputting the digital signal produced by the analog-to-digital converter.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
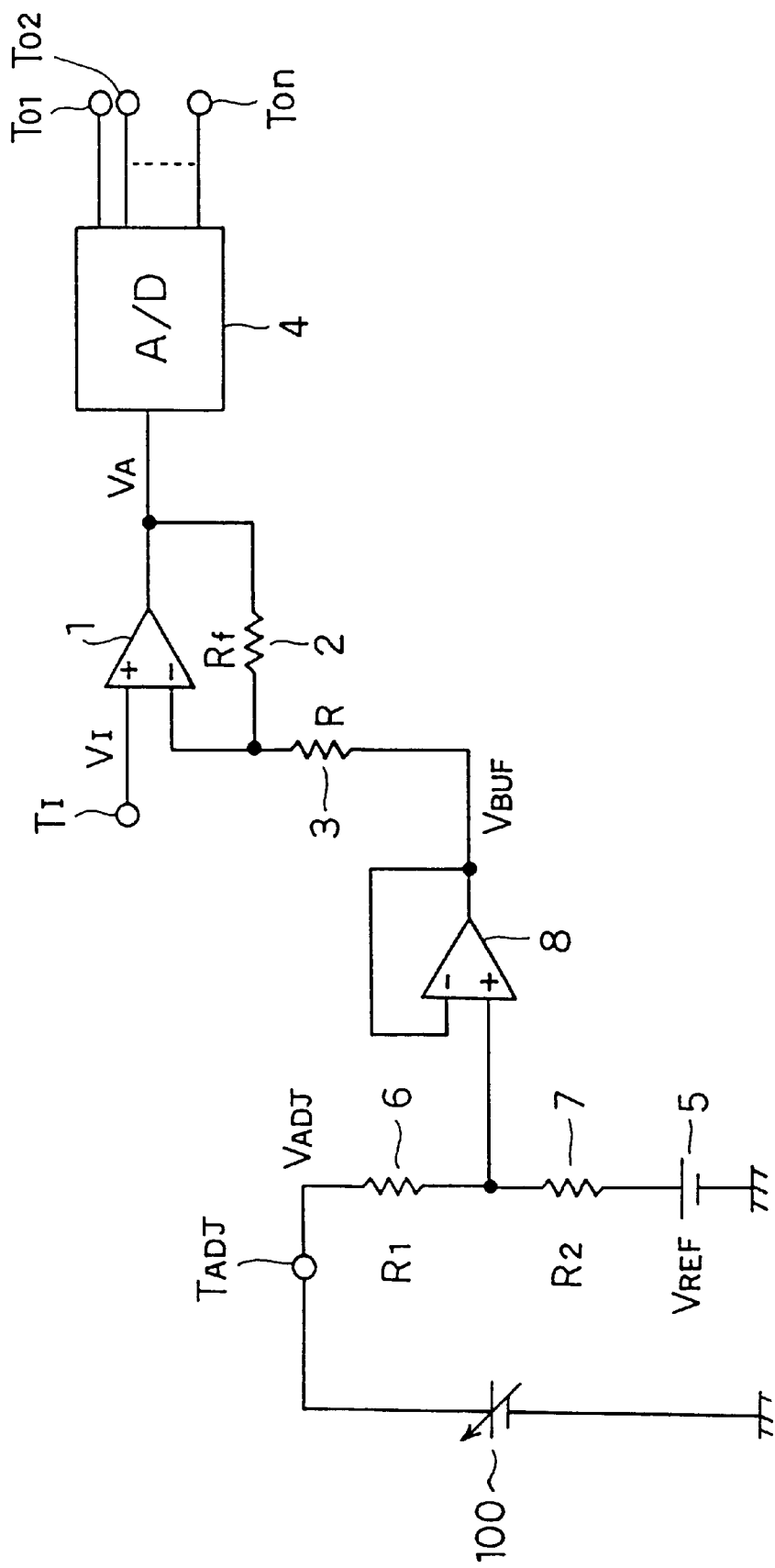
FIG. 1 is a block diagram of an A/D conversion device having an input level adjustment function embodying the invention.
Figure 3:
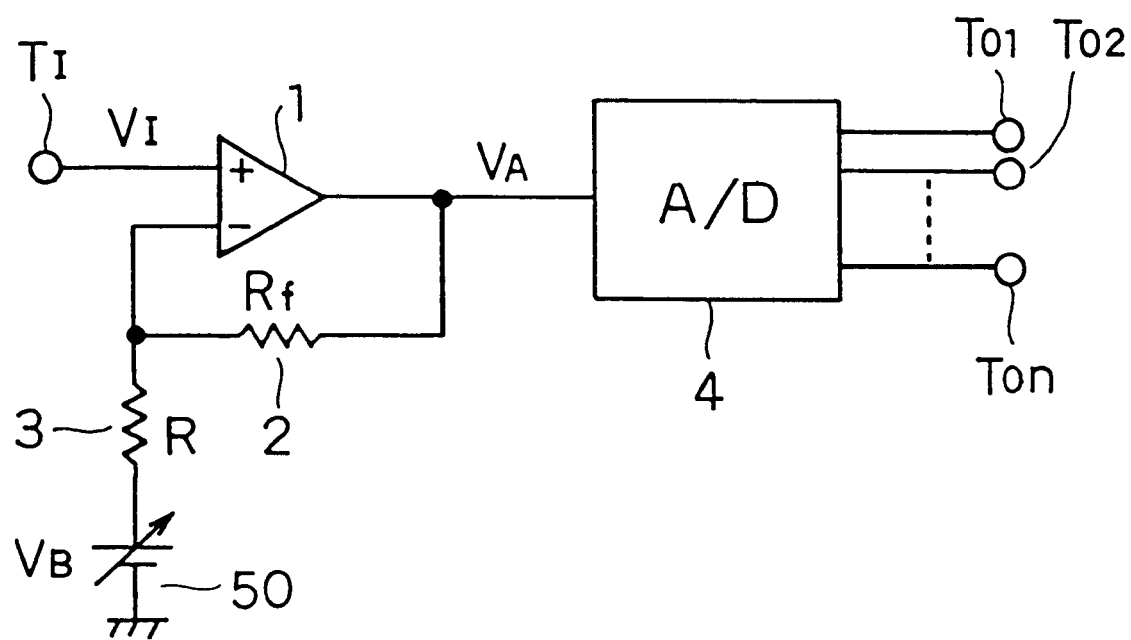
FIG. 3 is a block diagram of a conventional A/D conversion device having an input level adjustment function.

Hereinafter, an embodiment of the present invention will be described with reference to the accompanying drawings. FIG. 1 shows a block diagram of an A/D conversion device having a level adjustment function embodying the invention. In this figure, such components as are found also in FIG. 3 described previously are identified with the same reference numerals, and overlapping descriptions will not be repeated. As shown in FIG. 1, the A/D conversion device of this embodiment is further provided with a constant voltage source 5, resistors 6 and 7, and an operational amplifier 8.

The resistors 6 and 7 are connected in series between a terminal $T_{ADJ}$ for receiving a direct-current voltage from a direct-current source 100 and the constant voltage source 5. In cases where the A/D conversion device is never used with the terminal $T_{ADJ}$ open, a buffer amplifier can be inserted between the terminal $T_{ADJ}$ and the resistor 6. The operational amplifier 8 has its non-inverting input terminal (+) connected to the node between the resistors 6 and 7, and has its inverting input terminal (−) connected to the output terminal of the operational amplifier 8 itself. The output terminal of the operational amplifier 8 is connected to one end of the resistor 3.

In FIG. 1, if it is assumed that the voltage of the signal fed in via the terminal $T_I$, is $V_I$, the resistances of the resistors 2 and 3 are $R_f$ and $R$ respectively, and the output voltage of the operational amplifier 8 is $V_{BUF}$, then the voltage $V_A$ of the analog signal fed to the A/D converter 4 is given as $$V_A = \{(R_f+R)/R\}V_I - (R_f/R)V_{BUF}$$

Moreover, since the operational amplifier 8 functions as a buffer amplifier, if it is assumed that the voltage fed in via the terminal $T_{ADJ}$ is $V_{ADJ}$, the constant voltage of the constant voltage source 8 is $V_{REF}$, and the resistances of the resistors 6 and 7 are $R_1$ and $R_2$ respectively, then the output voltage $V_{BUF}$ of the operational amplifier 8 is given as $$V_{BUF} = \{R_1/(R_1+R_2)\}V_{REF} + \{R_2/(R_1+R_2)\}V_{ADJ}$$

Accordingly, by adjusting the voltage $V_{ADJ}$ fed in via the terminal $T_{ADJ}$, just as in the conventional A/D conversion device described earlier, it is possible to prevent the output digital signal from being distorted. Here, to vary the DC level of the voltage $V_A$ of the analog signal fed to the A/D converter 4 by $\Delta V_A$, the voltage $V_{ADJ}$ fed in via the terminal $T_{ADJ}$ needs to be varied by $\Delta V_{ADJ}$, which is given by $$\Delta V_{ADJ} = -(R/R_f) \times \{(R_1+R_2)/R_2\} \times \Delta V_A$$

Thus, a given change in the DC level of the voltage $V_A$ of the analog signal fed top the A/D converter 4 can be achieved by varying the voltage $V_{ADJ}$ in a wider range than in the conventional A/D conversion device. This permits adjustments needed to prevent the output digital signal from being distorted to be made with more ease.

Moreover, in the A/D conversion device of this embodiment, even if the terminal $T_{ADJ}$ is left open, the voltage $V_{REF}$ of the constant voltage source 5 is present, and thus it never occurs that an indeterminate voltage is fed to the inverting input terminal (−) of the operational amplifier 1 and makes the entire circuit inoperative.

The constant voltage $V_{REF}$ of the constant voltage source 5 is set, for example, at a value that permits the analog signal fed to the A/D converter 4 to lie well within the range of the A/D converter 4 (i.e. the range of voltages that the A/D converter 4 can handle) when the terminal $T_{ADJ}$ is open as long as the DC level of the analog signal fed in via the terminal $T_I$ lies within an ideal range.

Moreover, in the A/D conversion device of this embodiment, adjustment is achieved by the use of a voltage that is fed in from the outside. This helps alleviate the requirements imposed on the circuit elements that are to be assembled together and thereby facilitate the manufacture of the A/D conversion device.

Figure 2:
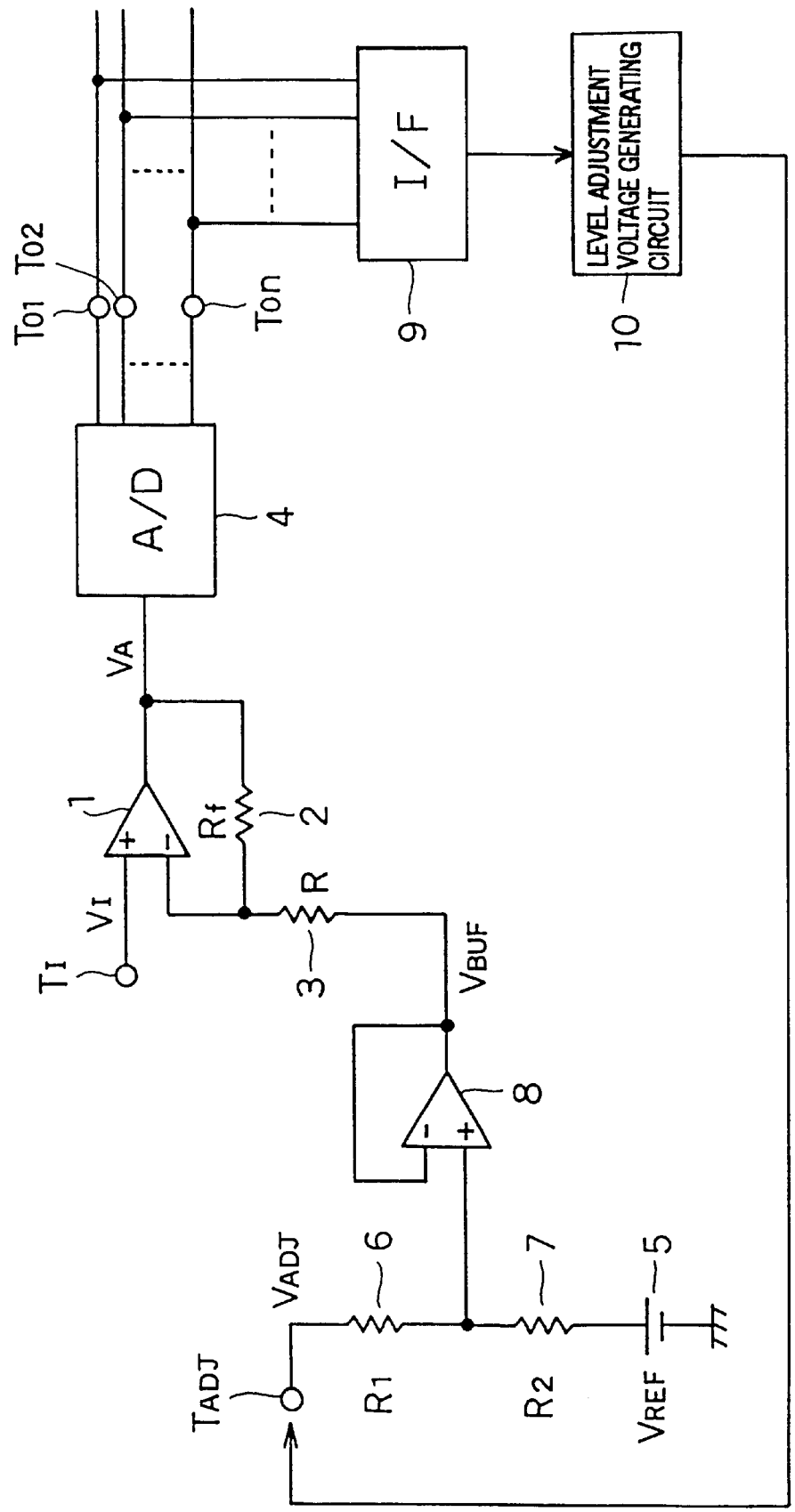
FIG. 2 is a diagram showing an example of how the A/D conversion device shown in FIG. 1 is used.

In FIG. 1, a level adjustment voltage generating circuit may be provided between the digital signal output terminals $T_{O1}, T_{O2}, \ldots, T_{On}$, and the terminal $T_{ADJ}$. Specifically, as shown in FIG. 2, a level adjustment voltage generating circuit 10 may be additionally provided that receives through an interface circuit 9 the digital signal output from the A/D converter 4 and that produces a voltage on the basis of the digital signal it has received. In that case, the output voltage of this level adjustment voltage generating circuit 10 is fed to the terminal $T_{ADJ}$, and thereby feedback is achieved with respect to the voltage fed to the terminal $T_{ADJ}$ in such a way that the analog signal fed to the A/D converter 4 lies well within the range of the A/D converter 4. In this way, it is possible to keep the output digital signal free from distortion.

The A/D converter 4 may achieve A/D conversion by any method; for example, it may rely on successive, following, continuous, or parallel approximation.

As described above, according to the present invention, in an A/D conversion device, a given change in the DC level of the analog signal fed to an A/D converter can be achieved by adjusting a voltage in a wider range than ever, and thus adjustments needed to prevent the output digital signal from being distorted can be made with more ease.

What is claimed is:

1. An analog-to-digital conversion device having an input level adjustment function that converts an analog signal fed thereto into a digital signal to be output and that allows adjustment of a DC level of the analog signal fed thereto, comprising:

a terminal for receiving a voltage from outside;

a voltage division circuit for dividing a voltage difference between the voltage received at the terminal and an internal constant voltage;

a buffer amplifier that receives a voltage resulting from voltage division performed by the voltage division circuit;

a negative-feedback-type amplifier that receives the analog signal and that uses as a reference voltage a voltage output from the buffer amplifier; and an analog-to-digital converter for converting a signal output from the negative-feedback-type amplifier into a digital signal.

2. An analog-to-digital conversion device comprising:

a signal input terminal for receiving an analog signal;

a direct-current voltage source whose output voltage can be varied;

a direct-current voltage input terminal for receiving a direct-current voltage output from the direct-current voltage source;

a first resistor, a second resistor, and a constant voltage source connected in series in this order from the direct-current voltage input terminal;

an amplifier having an input terminal connected to a node between the first and second resistors;

an operational amplifier having a first input terminal, a second input terminal, and an output terminal, the first input terminal being connected to the signal input terminal, the second input terminal being connected through a third resistor to the output terminal of the operational amplifier itself and connected also to the output terminal of the amplifier;

an analog-to-digital converter for performing analog-to-digital conversion on an output voltage of the operational amplifier; and a signal output terminal for outputting a digital signal produced by the analog-to-digital converter.

3. An analog-to-digital conversion device as claimed in claim 2, wherein the direct-current voltage source produces the direct-current voltage on a basis of the digital signal appearing at the signal output terminal.

* * * * *